United States Patent [19]

Fiedziuszko

[11] Patent Number: 4,565,979
[45] Date of Patent: Jan. 21, 1986

[54] DOUBLE DIELECTRIC RESONATOR STABILIZED OSCILLATOR

[75] Inventor: Slawomir J. Fiedziuszko, Palo Alto, Calif.

[73] Assignee: Ford Aerospace & Communications Corporation, Detroit, Mich.

[21] Appl. No.: 679,852

[22] Filed: Dec. 10, 1984

[51] Int. Cl.$^4$ .............................................. H03B 7/00
[52] U.S. Cl. .............................. 331/117 D; 331/96; 331/176
[58] Field of Search .............. 331/96, 117 D, 107 SL, 331/99, 176

[56] References Cited

U.S. PATENT DOCUMENTS

| | | | |
|---|---|---|---|
| 3,475,642 | 10/1969 | Karp et al. | 315/3.5 |
| 4,079,341 | 3/1978 | Linn et al. | 331/96 |
| 4,149,127 | 4/1979 | Murakami et al. | 331/96 |
| 4,187,476 | 2/1980 | Shinkawa et al. | 331/117 D |
| 4,307,352 | 12/1981 | Shinkawa et al. | 331/99 |
| 4,331,940 | 5/1982 | Uwano | 331/99 |
| 4,333,062 | 6/1982 | Uwano | 331/99 |
| 4,357,582 | 11/1982 | Ishihara et al. | 331/96 |
| 4,435,688 | 3/1984 | Shinkawa et al. | 331/99 |
| 4,445,097 | 4/1984 | Godart et al. | 331/117 D |

FOREIGN PATENT DOCUMENTS 0104303 6/1982 Japan ..................... 331/96

OTHER PUBLICATIONS

Komatsu et al., "A Frequency-Stabilized MIC Oscillator Using a Newly-Developed Dielectric Resonator", 1981 IEEE MTT-S International Microwave Symposium Digest, Los Angeles, Cal., Jun. 15-19, 1981.
Stiglitz, M. R., "Frequency Tuning of Rutile Resonators", *Proceedings of the IEEE*, Mar. 1966, pp. 413-414.
Karp, A. et al., "Circuit Properties of Microwave Dielectric Resonators", IEEE Transactions on Microwave Theory and Techniques, vol. MTT-16, No. 10, Oct. 1968, pp. 818-828.
Gerdine, M. A., "A Frequency-Stabilized Microwave Band-Rejection Filter Using High Dielectric Constant Resonators", *IEEE Transactions on Microwave Theory and Techniques*, vol. MTT-17, No. 7, Jul. 1969, pp. 354-359.
Fiedziuszko, S. et al., "Double Dielectric Resonator", *IEEE Transactions on Microwave Theory and Techniques*, Sep. 1971, pp. 779-781.
Maj, S. et al., "A Composite, Multilayered Cylindrical Dielectric Resonator", 1984, IEEE MTT-S Digest, pp. 190-192.

Primary Examiner—Eugene R. LaRoche
Assistant Examiner—Robert J. Pascal
Attorney, Agent, or Firm—Edward J. Radlo; Robert D. Sanborn

[57] ABSTRACT

A double dielectric resonator (1) having lower and upper preferably cylindrical dielectric elements (3, 5, respectively) is used to stabilize an oscillator operating at microwave frequencies. The dielectric elements (3, 5) are separated by a distance (d) which is greater than zero but less than an amount that will eliminate magnetic coupling between the dielectric elements (3, 5), and preferably less than an amount that will push the oscillator into a nonlinear region of the frequency versus separation (d) curve. The major axes (43, 45, respectively) of the dielectric elements (3, 5) are aligned, or else parallel but offset slightly. The invention may be used with reflection type, parallel feedback, and series feedback oscillators. Fine tuning may be achieved by means of a preferably dielectric tuning screw (37), which preferably has a thermal expansion coefficient between those of the dielectric elements (3, 5) and electrically conductive supporting walls (33, 35) to enhance the temperature compensation of the oscillator.

14 Claims, 8 Drawing Figures

REFLECTION TYPE OSCILLATOR

PARALLEL FEEDBACK OSCILLATOR

SERIES FEEDBACK OSCILLATOR

DOUBLE DIELECTRIC RESONATOR STABILIZED OSCILLATOR

TECHNICAL FIELD

This invention pertains to the field of frequency stabilized electronic oscillators, particularly those operating at microwave frequencies.

BACKGROUND ART

U.S. Pat. Nos. 4,079,341; 4,149,127; 4,187,476; 4,307,352; 4,331,940; 4,333,062; 4,357,582; 4,435,688; and 4,445,097 disclose oscillators stabilized by single dielectric resonators.

Stiglitz, M. R., "Frequency Tuning of Rutile Resonators", *Proceedings of the IEEE*, March 1966, pp. 413-414, shows, in a waveguide environment, the effect on tuning range when one disk of a double dielectric resonator is made thicker than the other disk.

Karp, A. et al., "Circuit Properties of Microwave Dielectric Resonators", *IEEE Transactions on Microwave Theory and Techniques*, Vol. MTT-16, No. 10, October 1968, pp. 818-828, discusses tuning of multiple dielectric resonators.

Gerdine, M. A., "A Frequency-Stabilized Microwave Band-Rejection Filter Using High Dielectric Constant Resonators", *IEEE Transactions on Microwave Theory and Techniques*, Vol. MTT-17, No. 7, July 1969, pp. 354-359, discusses temperature compensation of multiple dielectric resonators.

U.S. Pat. No. 3,475,642 discloses the use of several dielectric resonators as a slow wave structure.

Fiedziuszko, S. et al., "Double Dielectric Resonator", *IEEE Transactions on Microwave Theory and Techniques*, September 1971, pp. 779-781, calculates and measures the resonant frequency of double dielectric resonators from their physical dimensions and dielectric constants.

Maj, S. et al., "A Composite, Multilayered Cylindrical Dielectric Resonator", 1984 *IEEE MTT-S Digest*, pp. 190-192, analyzes multiple dielectric resonators.

DISCLOSURE OF INVENTION

A double dielectric resonator (1) is used to stabilize the frequency of an electronic oscillator which is typically operating at a microwave frequency. The oscillator may be of the reflection type (FIG. 1), the parallel feedback type (FIG. 2), or the series feedback type (FIG. 3). The resonator (1) comprises lower and upper dielectric elements (3, 5, respectively) separated by a nonzero magnetically couplable distance (d) and having principal axes (43, 45, respectively) that are aligned, or else parallel but slightly offset.

Fine tuning is achieved by means of a tuning screw (37) rigidly affixed to the upper dielectric element (5). The screw (37) is preferably fabricated of a material having a thermal coefficient of expansion between those of the dielectric elements (3, 5) and conductive enclosure supporting walls (33, 35), to compensate for frequency drift caused by said components (3, 5, 33, 35) having different thermal coefficients of expansion.

Comparaed with the prior art approaches of using single dielectric resonators to frequency stabilize oscillators, even assuming that these prior approaches utilized tuning screws for fine adjustments, the present invention offers the following advantages:

1. The oscillator may be tuned over a wider frequency range;
2. The frequency range of the oscillator has a region which is substantially linear, simplifying frequency adjustments;
3. The drift in frequency caused by temperature changes is reduced;
4. The oscillator may be temperature compensated by automatically changing the separation (d) between the dielectric elements (3, 5); and
5. The double dielectric resonator (1) has a higher Q than single dielectric resonators tuned with metal screws, producing a narrower and higher output power spike at the desired frequency of operation.

BRIEF DESCRIPTION OF THE DRAWINGS

These and other more detailed and specific objects and features of the present invention are more fully disclosed in the following specification, reference being had to the accompanying drawings, in which.

DETAILED DESCRIPTION OF THE PREFERRED EMBODIMENTS

This invention has its greatest applicability, and will be illustrated, in conjunction with circuits operating at microwave frequencies, i.e., frequencies higher than 1 GHz.

Figure 1:
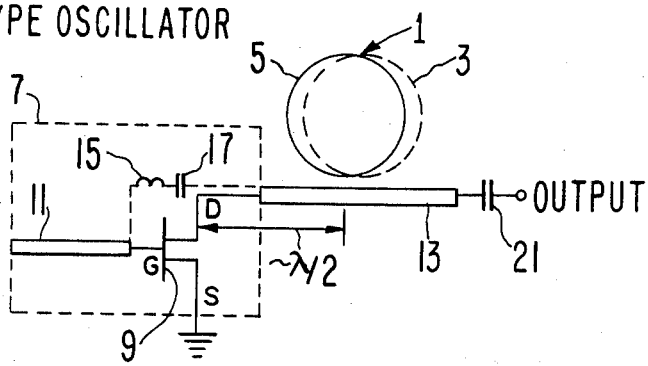
FIG. 1 is a circuit diagram showing the double dielectric resonator 1 of the present invention used to stabilize a reflection type oscillator.

The oscillator depicted in FIG. 1 is of the self-oscillating reflection type. A negative impedance device 7, shown as a dotted box in FIG. 1, generates an unstable sinusoidal RF oscillation along output line 13, which is depicted as a microstrip conductor. Negative impedance device 7 may be a field effect transistor 9 as depicted in FIG. 1, a bipolar transistor, or a negative impedance diode, such as a Gunn diode or Impatt diode. In the FET 9 embodiment illustrated, input microstrip conductor stub 11 is coupled to the gate of FET 9 and has a length that will produce a negative impedance. Output line 13 is coupled to the drain of FET 9, whose source is grounded. When a bipolar transistor is used for device 7, the collector usually takes the place of the drain and the emitter usually takes the place of the source.

Optional series L/C circuit 15, 17, coupled between the gate and drain of FET 9, provides a low Q feedback path to enhance oscillations. D.c. blocking bias setting capacitor 21 is coupled between output conductor 13 and the output terminal.

Double dielectric resonator 1 is magnetically loosely coupled to output line 13 at a point approximately a half wavelength from the output port (here the drain) of negative impedance device 9, and, acting as a bandstop filter, serves to reflect back a certain amount of power to injection lock the power appearing at the output conductor 13 at the resonant frequency of resonator 1. This is graphically illustrated in FIGS. 7 and 8.

Figure 7:
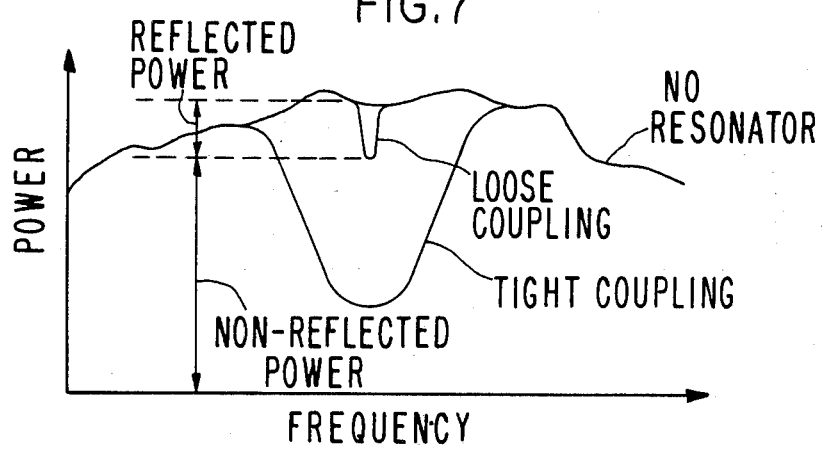
FIG. 7 is a graph showing reflected and non-reflected power in the FIG. 1 circuit.

In a first curve depicted in FIG. 7, no resonator 1 is present; this curve, which represents the non-reflected power as a function of frequency, shows that this power is spread out over a wide frequency range.

In a second curve depicted in FIG. 7, a double dielectric resonator 1 is tightly coupled to output line 13. As used herein, "tight coupling" means that more than 3 dB of power is reflected back to device 7. The second curve differs from the first curve in that it has a dip surrounding the resonant frequency of resonator 1, representing the power reflected back to device 7.

A third curve illustrated in FIG. 7 depicts the case in which double dielectric resonator 1 is loosely coupled to output line 13. As used herein, "loose coupling" means that between 0.5 dB and 3 dB of power is reflected back to device 7. The third curve differs from the first curve in that it has a dip adjacent the resonant frequency of resonator 1, representing the amount of power reflected by resonator 1 back to device 7. Compared with the case of tight coupling, it can be seen that the reflected power occurs over a relatively narrow range of frequencies.

Figure 8:
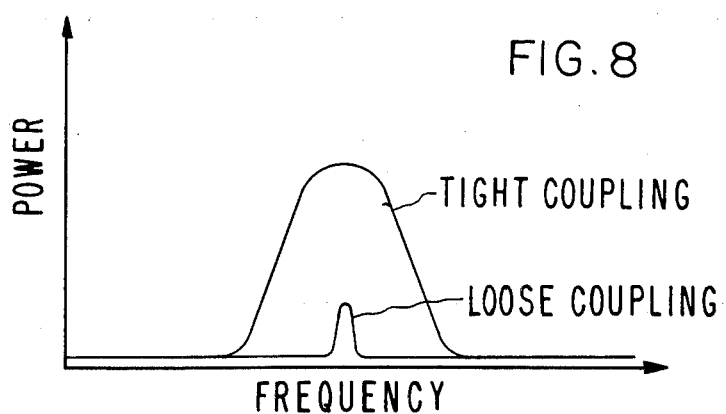
FIG. 8 is a graph showing the output power obtained from the FIG. 1 circuit when a double dielectric resonator 1 is employed as taught herein.

FIG. 8 shows the power appearing at the output terminal side of output conductor 13 of the FIG. 1 oscillator for the tight and loose coupling cases illustrated in FIG. 7. The frequency scales of FIGS. 7 and 8 are aligned. It can be seen from FIG. 8 that for the tight coupling case, the output power is diffused over a relatively wide range of frequencies, whereas for the loose coupling case, the power is concentrated at a relatively narrow range of frequencies as desired for any oscillator.

For all three oscillators (FIGS. 1-3), the desired degree of coupling between the resonator 1 and the conductor(s) 13-15 is best determined experimentally, and is a function of circuit parameters, including width of the conductor(s) 13-15. Resonator 1 may be spaced apart from the conductor(s) 13-15 (as illustrated in the Figs.) or overlap the conductor(s) 13-15, as long as not centered thereover, for then no coupling would occur.

Figure 2:
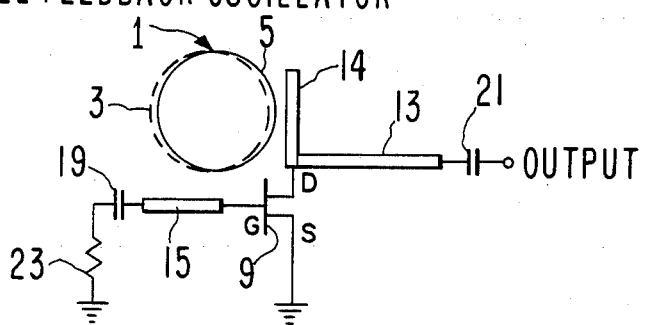
FIG. 2 is a circuit diagram showing the double dielectric resonator 1 of the present invention used to stabilize a parallel feedback oscillator.

FIG. 2 illustrates a parallel feedback oscillator circuit employing the present invention. This oscillator, as contrasted with the oscillators of FIGS. 1 and 3, does not self-oscillate; rather, it is an amplifier circuit. This type of oscillator requires that resonator 1 be magnetically coupled to the input as well as the output of the active device 9, which may be an FET or bipolar transistor. Power FETs 9 are appropriate because they have excellent phase noise characteristics. When a bipolar transistor is used for device 9, the collector can occupy the place of the drain and the emitter can occupy the place of the source, or vice versa.

A not necessarily vertical coupling stub 14 is connected to horizontal output line 13 to provide a region at the device 9 output for coupling to resonator 1. Coupling between resonator 1 and the input of device 9 is accomplished by means of input stub 15, connected to the gate of the illustrated FET 9.

Capacitors 19 and 21 are d.c. blocking bias setting capacitors connected to those ends of input line 15 and output line 13, respectively, that are remote from FET 9. As in FIG. 1, the source of FET 9 is grounded. Resistor 23, coupled between input blocking capacitor 19 and ground, has a value equal to the characteristic impedance of input conductor 15, usually 50 ohms. Use of the resistor 23 terminated gate assures good out-of-band stability and prevents the oscillator from engaging in spurious oscillations and mode jumping.

Double dielectric resonator 1 is experimentally positioned with respect to the input line 15 and output stub 14 so that the power coupling coefficient times the gain of FET 9 equals 1, a necessary condition to sustain oscillations in this type of oscillator.

Figure 3:
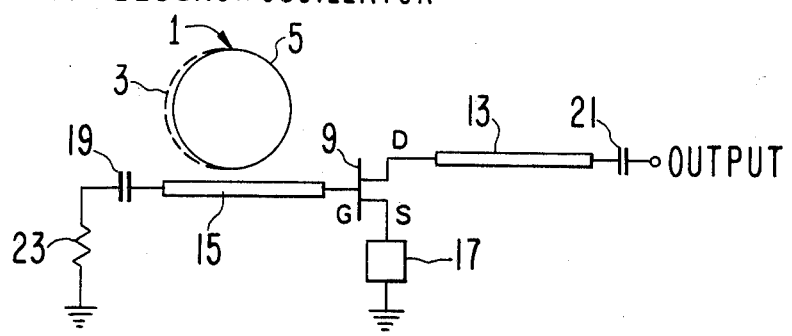
FIG. 3 is a circuit diagram showing the double dielectric resonator 1 of the present invention used to stabilize a series feedback oscillator.

FIG. 3 illustrates the invention in use with an oscillator of the series feedback type. Out of the three oscillator circuits depicted, this is the preferred approach, because (1) it is more convenient to couple the double dielectric resonator 1 to just one conductor 15 as compared with two conductors 14, 15 for the FIG. 2 circuit, and (2) it is not as sensitive to output loads as the FIG. 1 circuit, since resonator 1 is isolated from the output terminal by device 9. Device 9 may be a field effect or bipolar transistor. A reverse channel FET 9 is appropriate for high or medium power applications.

Like the FIG. 1 circuit, the series feedback oscillator depicted in FIG. 3 is capable of self-oscillation. The FIG. 3 circuit is like that of FIG. 2 except that resonator 1 is not coupled to the output of device 9; rather, resonator 1 is coupled to just input line 15, at a point along line 15 determined by the desired frequency of self-oscillation. Resonator 1 should also be tuned to this same frequency, and serves to create a very high Q open circuit at this point. Additionally, microstrip conductor 17 is positioned between the source of FET 9 and ground to enhance RF grounding. This is not necessary for the FIG. 2 circuit.

Figure 4:
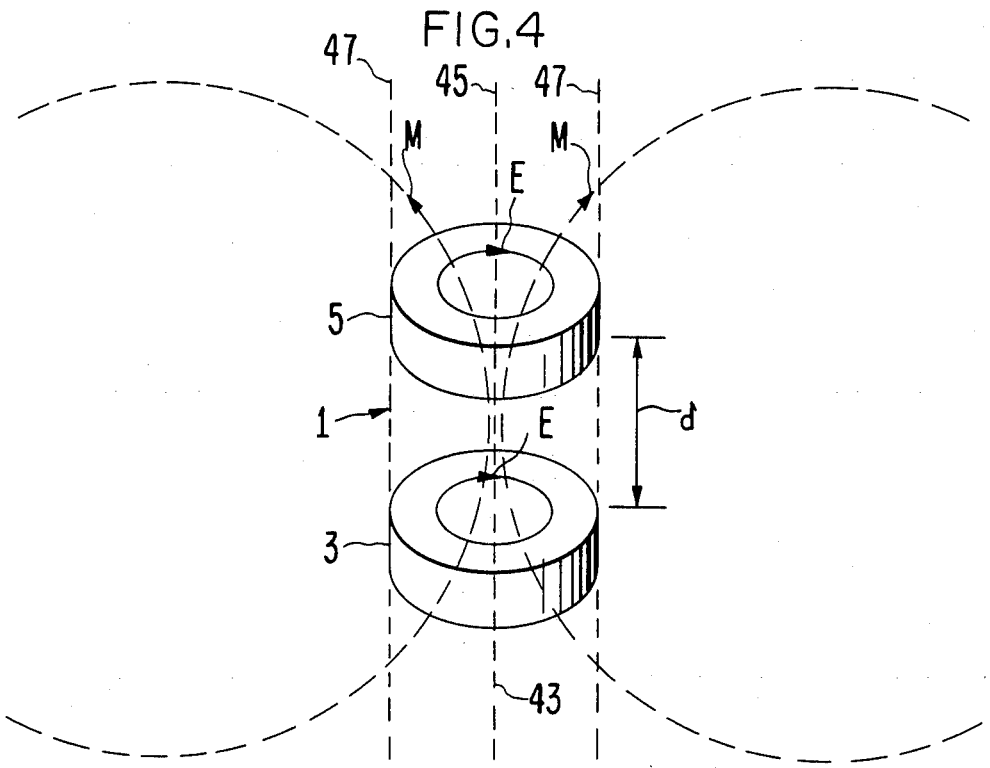
FIG. 4 is an exploded isometric view showing the electrical (E) and magnetic (M) field lines coursing through double dielectric resonator 1.

FIG. 4 illustrates details of double dielectric resonator 1, which comprises lower and upper dielectric elements 3 and 5, respectively. Elements 3 and 5 preferably although not necessarily have the same physical dimensions and dielectric constant. In the illustrated embodiments, elements 3 and 5 have the shape of solid cylindrical disks. The cylindrical shape is preferred because when an element 3, 5 is rotated by means of a tuning screw 37, just the separation d changes; the imaginary wall 47 surrounding resonator 1 does not change shape. This facilitates frequency tuning of the oscillator.

Figure 5:
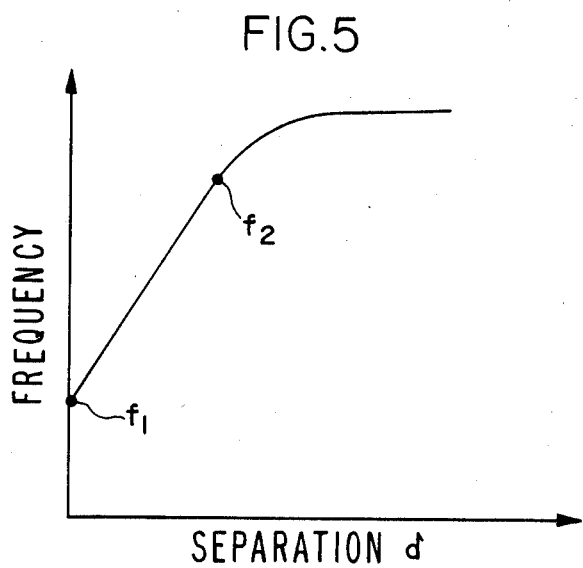
FIG. 5 is a graph showing the resonant frequency of double dielectric resonator 1, and hence the resonant frequency of the oscillator, as a function of the separation d between the dielectric elements 3, 5.

The major axes of elements 3 and 5 are denominated 43 and 45, respectively, and may be aligned as shown in FIG. 4. Alternatively, axes 43, 45 may be parallel but slightly offset as shown in FIGS. 1, 2, 3, and 6, in order to enhance the linearization of the curve of oscillator frequency versus separation d (FIG. 5).

For the depicted geometry, FIG. 4 shows that the electrical (E) field lines in each cylinder 3, 5 follow circular paths parallel to the plane in which the cylinder 3, 5 lies. The magnetic (M) field lines pass through each cylinder 3, 5 in large circles that are perpendicular to the planes in which cylinders 3, 5 lie. FIG. 4 illustrates the case where resonator 1 is not proximate large electrically conductive objects. The presence of such objects, e.g., ground planes 27 and 29, compresses the magnetic field lines, increasing the resonant frequency of resonator 1. As a first order approximation, the cylindrical boundary 47 of resonator 1 is a magnetic wall, i.e., an imaginary wall that short circuits the magnetic field.

The dielectric elements 3, 5 are separated by a distance d which is greater than zero but not so great as to eliminate magnetic coupling between elements 3, 5. Additionally, d is less than D-a-b, where D is the available opening of the enclosure surrounding the oscillator (see FIG. 6), a is the thickness of element 3 and b is the thickness of element 5.

Holes are optionally bored through cylinders 3 and 5, turning them into toroids, to increase the frequency spacing between the fundamental mode and spurious modes.

FIG. 5 shows that the resonant frequency of resonator 1 as a function of separation distance d has a linear region bounded by frequencies f1 and f2. The resonator 1 resonant frequency controls the frequency of the oscillator for all thre oscillator types (FIGS. 1-3). It is often convenient to operate the oscillator in this linear region to facilitate linearly changing the frequency thereof. Thus, d is preferably chosen within this region. The Fiedziuszko et al. paper, supra, illustrates how one calculates the resonant frequency of the resonator 1 from its physical dimensions (including d) and dielectric constant.

Figure 6:
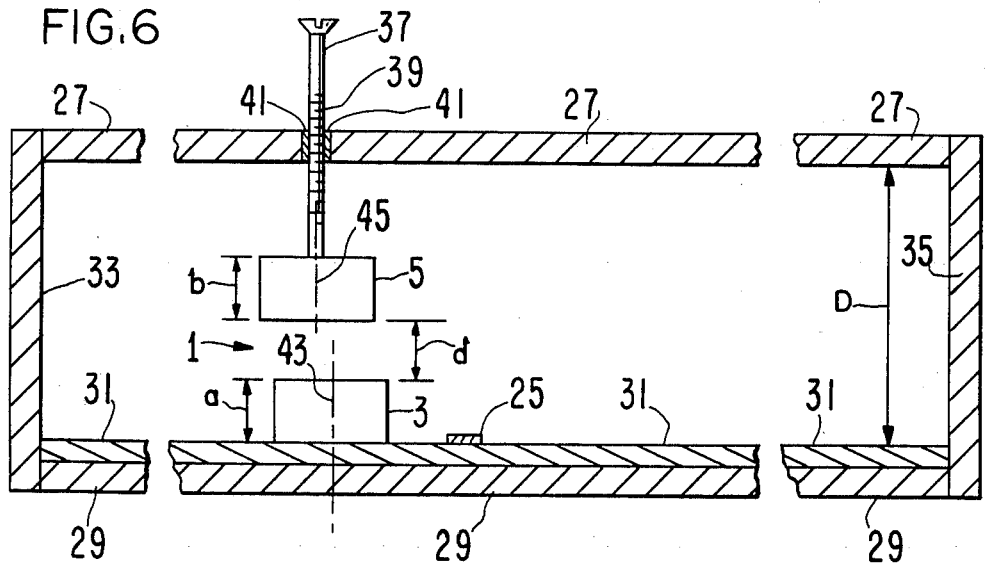
FIG. 6 is a side view not to scale, partially in cross-section, showing resonator 1 in use in a microstrip oscillator circuit.

FIG. 6 illustrates the embodiment in which the oscillator, as represented by microstrip conductor 25, is embodied in microstrip. For microstrip circuits, the thin (typically about a mil thick) conductor portions 25 are spaced apart from an upper electrically conductive ground plane 27 and positioned on a dielectric substrate 31 which, in turn, rests on a lower electrically conductive ground plane 29. Electrically conductive walls 33, 35, which support and connect the ground planes 27, 29, are remote from the active elements (1, 25) of the oscillator. However, the invention can be used in other circuits, e.g., suspended substrate, in which substrate 31 and ground plane 29 are spaced apart, or waveguide circuits, in which conductive walls 33, 35 are proximate the active elements (1, 25) of the oscillator.

Elements 3 and 5 should be fabricated of a material having a high Q (to focus the output power of the oscillator over a narrow frequency range), high temperature stability, and a high dielectric constant (to minimize the physical dimensions of the elements 3, 5). Normally there is an inverse relationship between a material's Q and its dielectric loss tangent. Suitable materials for elements 3, 5 are Resomics ™ R-03C and R-04C, manufactured by Murata Manufacturing Company. R-03C has an unloaded Q of 15,000 and a dielectric constant of 30. It consists of $Ba(NiTa)O_3-Ba(ZrZnTa)O_3$ with added perovskite. R-04C has an unloaded Q of 8000 and a dielectric constant of 37. It consists of $(ZrSn)TiO_4$.

Ground planes 27 and 29, as well as supporting walls 33 and 35, are typically fabricated of aluminum.

Substrate 31 should have a dielectric constant substantially less than that of resonator 1. Suitable materials for substrate 31, which is typically about 10 mils thick, are alumina and Duroid ™ (fiberglas filled teflon).

Tuning screw 37 is preferably dielectric rather than metal, to avoid lowering the Q of resonator 1. Screw 37 is rigidly affixed to the top of dielectric element 5. Screw 37 has threads 39 which mate with threads 41 surrounding a hole through upper ground plane 27. With this type of a tuning screw 37, and with cylindrical dielectric elements 3 and 5, it can be seen that rotating screw 37 has a linear effect on changing the separation d, and thus a linear effect on changing the oscillator frequency, assuming that d is within the linear domain of the FIG. 5 curve.

As with any oscillator, it is important that the oscillator be temperature stabilized. To begin with, the material for resonator 1 should be selected, if possible, with built-in temperature compensation, e.g., doping, to compensate for the fact that the material normally expands with increasing temperature, causing a corresponding frequency shift.

When the materials for resonator 1 do not have built-in temperature compensation, or when this compensation is inadequate, some additional temperature compensation may be necessary. For example, when walls 33, 35 are fabricated of aluminum, which has a thermal expansion coefficient of approximately 23 ppm/°C., and resonator 1 is fabricated of R-03C or R-04C, which have a thermal expansion coefficient of approximately 6 ppm/°C., as the temperature increases, d increases, raising the frequency of the oscillator. This can be compensated for by fabricating screw 37 of a material having a thermal expansion coefficient greater than that of resonator 1, but less than that of walls 33, 35. The reason for screw 37 to have a thermal expansion coefficient greater than that of resonator 1 is so that the spacing between element 5 and ground plane 27 will increase with temperature, decreasing d. The reason for screw 37 to have a thermal expansion coefficient less than that of walls 33, 35, is that increasing the spacing between element 5 and ground plane 27 in itself lowers the resonant frequency, because element 5 is more remote from ground plane 27, and thus the magnetic field lines of resonator 1 are not as compressed.

An alternative method for accomplishing temperature compensation is for the two dielectric elements 3, 5 to have different resonant frequency temperature coefficients.

In an example of a series feedback oscillator that was built according to the teachings of the present invention (FIGS. 3 and 6), dielectric elements 3, 5 were each cylindrical having diameters of 0.350" and thicknesses $a=b=0.105"$, and were fabricated of Resomics ™ R-04C. Axes 43, 45 were aligned. Tuning screw 37 was dielectric. Ground planes 27, 29 and walls 33, 35 were aluminum, forming a rectangular enclosure 1.3" long by 1.3" wide by 0.44" high (D). The oscillator was placed in the middle of the enclosure on a copper-clad Duroid ™ substrate 31 that was 0.031 inches thick. The edge of element 3 was placed 0.032" from the near edge of input line 15, at a distance 0.400" from the gate of FET 9, a Toshiba S8803 reverse channel power FET. Conductor 15 was 0.090" wide. The separation distance d was varied from 0.001" to 0.035", resulting in an oscillator tuning range of 5.8 GHz to 6.3 GHz. Output power of the oscillator was 300 milliwatts.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A double dielectric resonator stabilized oscillator comprising:

oscillating means having an output conductor carrying an RF sinusoid at substantially one frequency; and in close proximity to the oscillating means and magnetically coupled thereto, a double dielectric resonator comprising upper and lower dielectric elements magnetically coupled to each other and separated from each other by a nonzero distance d.

2. The oscillator of claim 1 wherein the oscillating means is of the reflection type, i.e.:

the oscillating means further comprises a negative impedance device having an output port coupled to the output conductor; and the double dielectric resonator is magnetically coupled to the output conductor at a point approximately a half wavelength from the output port.

3. The oscillator of claim 2 wherein the negative impedance device is from the class of devices comprising FET's, bipolar transistors, Gunn diodes, and Impatt diodes.

4. The oscillator of claim 2 wherein the double dielectric resonator reflects between 0.5 dB and 3 dB of power from the output conductor back to the negative impedance device.

5. The oscillator of claim 1 wherein the oscillating means is of the parallel feedback type, i.e.:

the oscillating means further comprises an input port coupled to an input conductor; and the double dielectric resonator is magnetically coupled to both the input conductor and the output conductor.

6. The oscillator of claim 1 wherein the oscillating means is of the series feedback type, i.e.:

the oscillating means further comprises an input port coupled to an input conductor; and the double dielectric resonator is magnetically coupled to the input conductor but not to the output conductor, creating a very high Q open circuit at some point along the input conductor, said point being a function of the desired output frequency of the oscillator.

7. The oscillator of claim 1 wherein the curve of oscillator frequency as a function of separation d has a linear region; and d is selected so that the oscillator operates within said linear region.

8. The oscillator of claim 1 wherein the frequency of the oscillator is determined by selecting the physical dimensions and dielectric constant of the double dielectric resonator, and the separation d.

9. The oscillator of claim 1 wherein:

the oscillating means and the lower dielectric element are supported by a substantially planar dielectric substrate having a dielectric constant substantially less than that of the dielectric elements;

upper and lower electrically conductive ground planes are positioned on each side of the combination comprising the double dielectric resonator, the oscillating means, and the substrate; and the upper ground plane is spaced apart from the upper dielectric element.

10. The oscillator of claim 9 wherein the major axes of the upper and lower dielectric elements are aligned.

11. The oscillator of claim 9 wherein the major axes of the upper and lower dielectric elements are parallel and slightly spaced apart.

12. The oscillator of claim 9 wherein the dielectric elements are cylindrically shaped.

13. The oscillator of claim 9 further comprising a tuning screw rigidly attached to the upper dielectric element and protruding through the first ground plane, wherein turning the tuning screw effectuates changes in the separation d and hence in the oscillator frequency.

14. The oscillator of claim 13 further comprising electrically conductive walls supporting and connecting the upper and lower ground planes, wherein:

the materials comprising the double dielectric resonator and the walls have different thermal expansion coefficients, and, to compensate for frequency drift caused by these different thermal expansion coefficients, the tuning screw is fabricated of a material having a thermal expansion coefficient between those of the double dielectric resonator and the walls.

* * * * *